(12) United States Patent
Li et al.

(10) Patent No.: US 11,114,430 B2
(45) Date of Patent: Sep. 7, 2021

(54) LEAKAGE CURRENT DETECTION AND PROTECTION DEVICE AND POWER CONNECTOR EMPLOYING THE SAME

(71) Applicant: Chengli Li, Suzhou (CN)

(72) Inventors: Chengli Li, Suzhou (CN); Shengyun Nie, Suzhou (CN)

(73) Assignee: Chengli Li, Suzhou (CN)

( * ) Notice: Subject to any disclaimer, the term of this patent is extended or adjusted under 35 U.S.C. 154(b) by 105 days.

(21) Appl. No.: 16/670,808

(22) Filed: Oct. 31, 2019

(65) Prior Publication Data

US 2021/0118869 A1 Apr. 22, 2021

(30) Foreign Application Priority Data

Oct. 22, 2019 (CN) .......................... 201911006141.3
Oct. 22, 2019 (CN) .......................... 201921775874.9

(51) Int. Cl.
*H01L 27/02* (2006.01)
*H02H 3/02* (2006.01)
*G01R 31/50* (2020.01)

(52) U.S. Cl.
CPC .......... *H01L 27/0262* (2013.01); *G01R 31/50* (2020.01); *H02H 3/021* (2013.01)

(58) Field of Classification Search
CPC ..... H01L 27/0262; G01R 31/50; H02H 3/021
USPC ......................................................... 361/54
See application file for complete search history.

(56) References Cited

U.S. PATENT DOCUMENTS

| 8,054,590 B2* | 11/2011 | Li | H01H 83/04 |
| | | | 361/42 |
| 9,018,914 B2* | 4/2015 | Genova | H02J 7/00 |
| | | | 320/134 |
| 2005/0243484 A1* | 11/2005 | Kim | H02H 3/335 |
| | | | 361/42 |
| 2007/0146946 A1* | 6/2007 | Chen | H01H 83/14 |
| | | | 361/42 |
| 2012/0007621 A1* | 1/2012 | Yue | H02H 3/335 |
| | | | 324/750.3 |
| 2013/0155563 A1* | 6/2013 | Huang | H01R 13/6683 |
| | | | 361/93.1 |
| 2015/0349517 A1* | 12/2015 | Li | H02H 3/16 |
| | | | 361/42 |
| 2017/0149235 A1* | 5/2017 | Cui | H01H 83/04 |
| 2018/0278040 A1* | 9/2018 | Hao | H02H 3/335 |

* cited by examiner

*Primary Examiner* — Thienvu V Tran
*Assistant Examiner* — Sreeya Sreevatsa
(74) *Attorney, Agent, or Firm* — Chen Yoshimura LLP (57) ABSTRACT

A leakage current detection and protection device coupled between input and output ends of power lines, and includes first and second switching modules, a leakage current detection module, a self-test module, and first and second drive modules. When the leakage current detection module detects a leakage current on the power lines, the second drive module controls the second switching module to disconnect power to the output end. When the self-test module detects a fault in the leakage current detection module, the first drive module controls the first switching module to disconnect the power to the output ends. The first switching module is coupled between the input end and a point where the leakage current detection module, the self-test module, and the first and second drive modules are coupled, so that these modules are de-powered when the first switching module disconnects the electrical connection to output ends.

20 Claims, 4 Drawing Sheets

LEAKAGE CURRENT DETECTION AND PROTECTION DEVICE AND POWER CONNECTOR EMPLOYING THE SAME

BACKGROUND OF THE INVENTION

Field of the Invention

This invention relates to electrical appliances, and in particular, it relates to a leakage current detection and protection device.

Description of Related Art

With the increased awareness of safety in the use of electrical appliances, leakage current detection and protection device are becoming widely used. Current leakage current detection and protection devices still have some problems. For example, when some components of current detection circuit are faulty so that the leakage current detection and protection device loses its protection function, the electrical appliance may still be electrically connected to the power, which presents a safety threat.

A safer leakage current detection and protection device is needed.

SUMMARY

Accordingly, the present invention is directed to a leakage current detection and protection device which employs an additional trip coil, so that when one trip coil is damaged (e.g. open circuit), the leakage current detection and protection device can still function to interrupt the power output.

To achieve the above objects, the present invention provides a leakage current detection and protection device coupled between an input end and an output end of power lines, the device including: a first switching module and a second switching module, wherein each of the first and second switching modules is coupled on the power lines between the input end and the output end and is operable to connect or disconnect an electrical connection between the input and output ends; a leakage current detection module configured to detect a leakage current signal on the power lines and to generate a leakage fault signal in response to detecting the leakage current signal; a self-test module configured to detect a fault of the leakage current detection module and to output a self-test fault signal when the fault in the leakage current detection module is detected; a first drive module, coupled to the self-test module and the first switching module, and configured, in response to the self-test fault signal, to control the first switching module to disconnect the electrical connection between the input and output ends; and a second drive module, coupled to the leakage current detection module and the second switching module, and configured, in response to the leakage fault signal, to control the second switching module to disconnect the electrical connection between the input and output ends.

In some embodiments, the first switching module includes a first switch, the first drive module includes a first solenoid and a first semiconductor device coupled in series with the first solenoid, the first switch is coupled to the first solenoid, a control electrode of the first semiconductor device is coupled to the self-test module, the first semiconductor device is configured to become conductive in response to receiving the self-test fault signal at the control electrode, the first solenoid is configured to generate a magnetic field in response to the first semiconductor device becoming conductive, and the first switch is configured to disconnect the electrical connection in response to the magnetic field being generated in the first solenoid.

In some embodiments, the first switching module includes a first switch, the first drive module includes a first solenoid and at least two semiconductor devices, the first switch is coupled to the first solenoid, the least two semiconductor devices are coupled in parallel with each other and then coupled in series with the first solenoid, a control electrode of each of the at least two semiconductor devices is coupled to the self-test module, at least one of the at least two semiconductor devices is configured to become conductive in response to receiving the self-test fault signal at its control electrode, the first solenoid is configured to generate a magnetic field in response to the at least one of the at least two semiconductor devices becoming conductive, and the first switch is configured to disconnect the electrical connection in response to the magnetic field being generated in the first solenoid.

In some embodiments, the second switching module includes a second switch, the second drive module includes a second solenoid and a second semiconductor device coupled in series with the second solenoid, the second switch is coupled in series with the second solenoid, a control electrode of the second semiconductor device is coupled to the leakage current detection module, wherein either the second semiconductor device is configured to become conductive in response to receiving the leakage fault signal at its control electrode, the second solenoid is configured to generate a magnetic field in response to the second semiconductor device becoming conductive, and the second switch is configured to disconnect the electrical connection in response to the magnetic field being generated in the second solenoid, or the second solenoid is configured to generate a magnetic field in response to the second semiconductor device becoming a short circuit, and the second switch is configured to disconnect the electrical connection in response to the magnetic field being generated in the second solenoid.

In some embodiments, the second switching module includes a second switch, the second drive module includes a second solenoid and at least two semiconductor devices, the second switch is coupled to the second solenoid, the least two semiconductor devices are coupled in parallel with each other and then coupled in series with the second solenoid, and a control electrode of each of the at least two semiconductor devices is coupled to the leakage current detection module, wherein either at least one of the at least two semiconductor devices is configured to become conductive in response to receiving the leakage fault signal at its control electrode, the second solenoid is configured to generate a magnetic field in response to the at least one of the at least two semiconductor devices becoming conductive, and the second switch is configured to disconnect the electrical connection in response to the magnetic field being generated in the second solenoid, or the second solenoid is configured to generate a magnetic field in response to the at least one of the at least two semiconductor devices becoming a short circuit, and the second switch is configured to disconnect the electrical connection in response to the magnetic field being generated in the second solenoid.

In some embodiments, the second drive module includes a display module, coupled in parallel to the second semiconductor device or the at least two semiconductor devices, and configured to generate a warning display in response to the second solenoid becoming an open circuit.

In some embodiments, the first switch is a normally closed switch and is configured to be prevented from closing after becoming open in response to the magnetic field.

In some embodiments, the second switch is configured to be reset after becoming open in response to the magnetic field.

In some embodiments, the first semiconductor device, or each of the at least two semiconductor devices of the first drive module, or the second semiconductor device, or each of the at least two semiconductor devices of the second drive module is a silicon-controlled rectifier, a metal-oxide-semiconductor field-effect transistor, or a bipolar junction transistor.

In another aspect, the present invention provides a leakage current detection and protection device coupled between an input end and an output end of power lines, the device including: a first switching module and a second switching module, wherein each of the first and second switching modules is coupled on the power lines between the input end and the output end and is operable to connect or disconnect an electrical connection between the input and output ends; a leakage current detection module configured to detect a leakage current signal on the power lines and to generate a leakage fault signal in response to detecting the leakage current signal; a self-test module configured to detect a fault of the leakage current detection module and to output a self-test fault signal when the fault in the leakage current detection module is detected; a first drive module, coupled to the self-test module and the first switching module, and configured, in response to the self-test fault signal, to control the first switching module to disconnect the electrical connection between the input and output ends; and a second drive module, coupled to the leakage current detection module and the second switching module, and configured, in response to the leakage fault signal, to control the second switching module to disconnect the electrical connection between the input and output ends, wherein the first switching module is coupled on the power lines between the input end and a first point of the power lines, wherein the leakage current detection module, the self-test module, the first drive module and the second drive module are coupled to the power lines between the first point and the output end, and wherein when the first switching module disconnects the electrical connection between the input and output ends, the leakage current detection module, the self-test module, the first drive module and the second drive module are de-powered.

In some embodiments, the second solenoid is configured to supply a working power to the leakage current detection module.

In some embodiments, the self-test module generates a self-test fault signal in response to the second solenoid being an open circuit, and wherein the first drive module is configured, in response to receiving the self-test fault signal, to control the first switching module to disconnect the electrical connection between the input and output ends.

In another aspect, the present invention provides a power connector, which includes a shell, and the leakage current detection and protection device according to any one of the above embodiments disposed in the shell.

The above leakage current detection and protection device employs two switching modules to control the electrical disconnection between input and output ends in response to the leakage current signal and the self-test fault signal, respectively. This improves the protection function. Also, by connecting the working power supply of the control circuits between the two switching modules, when the self-test fault signal triggers the first switch to be open the working power to the control circuits is cut off, further improving the protection function.

BRIEF DESCRIPTION OF THE DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols.

DETAILED DESCRIPTION OF PREFERRED EMBODIMENTS

Embodiments of the present invention are described below with reference to the drawings. These drawings and descriptions explain embodiments the invention but do not limit the invention. Other embodiments are possible without departing from the spirit and scope of the invention. Various modification and variations can be made in both the structure and the working principle of the device. Thus, it is intended that the scope of the invention is defined by the appended claims.

Figure 1:
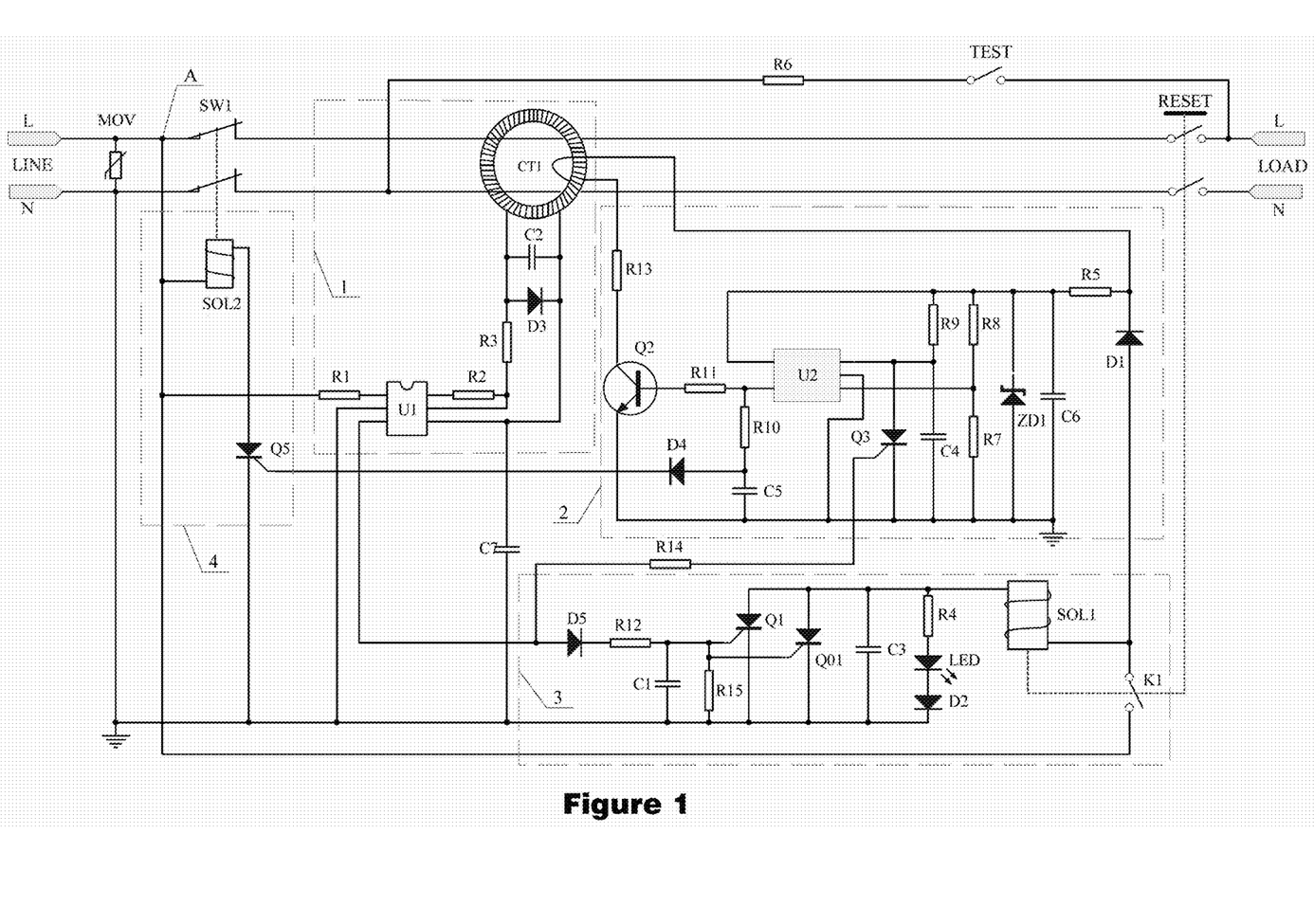
FIG. 1 is a circuit diagram of a leakage current detection and protection device according to a first embodiment of the present invention.

FIG. 1 is a circuit diagram of a leakage current detection and protection device according to a first embodiment of the present invention. As shown in FIG. 1, the leakage current detection and protection device includes a first switching module (indicated by SW1 in the drawings), a leakage current detection module 1, a self-test module 2, a second drive module 3, a first drive module 4, and a second switching module (indicated by RESET in the drawings). The first switching module is coupled on the power lines between the input end LINE and the output end LOAD, and operable to connect or disconnect the electrical connection between the input and output ends; the second switching module is also coupled on the power lines between the input end and the output end, and operable to connect or disconnect the electrical connection between the input and output ends; the first switching module is located closer to the input end LINE than the second switching module is. The leakage current detection module 1 is coupled to the power lines to detect a leakage current on the power lines at the output end LOAD. The self-test module 2 is coupled to the power lines and the leakage current detection module 1, configured to detect whether the leakage current detection module 1 is faulty. When the leakage current detection module 1 is faulty, the self-test module 2 generates a self-test fault signal (i.e. a signal indicating that the self-test module 2 is faulty). The second drive module 3 is coupled to the leakage current detection module 1 and the second switching module, and configured to, in response to the leakage current detection module 1 detecting a leakage current at the output end LOAD, control the second switching module to disconnect the electrical connection between the input end LINE and output end LOAD. The first drive module 4 is coupled to the first switching module and the self-test module 2, and configured to, in response to the self-test fault signal, control the first switching module to disconnect the electrical connection between the input end LINE and output end LOAD.

More specifically, as shown in FIG. 1, the first switching module includes a mechanical switch SW1 coupled on the power lines (L, N) near the input end LINE. The first drive module (drive circuit) 4 includes solenoid SOL2 and semiconductor device Q5. A first electrode (the anode in this example) of semiconductor device Q5 is coupled to a first end of the solenoid SOL2, a second electrode (e.g. cathode in this example) of semiconductor device Q5 is coupled to ground, and the control electrode of semiconductor device Q5 is coupled to the cathode of diode D4 of the self-test module 2. A second end of solenoid SOL2 is coupled to the input end at point A of the power supply line, where point A is located between the input end and the switch SW1. The leakage current detection module 1 includes a leakage current detector coil CT1 and a processor U1. The detector coil CT1 is coupled to the processor U1 via resistor R3. Processor U1 receives a working power via resistor R1. Processor U1 is coupled to the second drive module (drive circuit) 3 via diode D5. The self-test module 2 includes processor U2, semiconductor devices Q2 and Q3, and diode D4. Processor U2 is coupled to the control electrode (e.g., base in this example) of semiconductor device Q2 via resistor R11, and coupled to the anode of diode D4 and the first end of capacitor C5 via resistor R10. The first electrode (the collector in this example) of semiconductor device Q2 is coupled to the detector coil CT1 via resistor R13, and the second electrode (the emitter in this example) of semiconductor device Q2 is coupled to the second end of capacitor C5 (which is ground). Processor U2 is coupled to detector coil CT1 and the cathode of diode D1 via resistor R5. Diode D1 supplies a working power to the self-test module. The anode of diode D1 is coupled to one end of solenoid SOL1 of the second drive module 3 and one end of auxiliary switch K1. Processor U2 is coupled to a first electrode (the anode in this example) of semiconductor device Q3, an RC circuit (resistor R9, capacitor C4), and a reference voltage circuit (resistor R8, resistor R9 R7). Resistor R9 is coupled to resistor R5. The control electrode of semiconductor device Q3 is coupled to the anode of diode D5 of the second drive module 3 via resistor R14. The second drive module 3 further includes semiconductor devices Q1 and Q01 coupled in parallel, and light emitting diode LED. The cathode of diode D5 is coupled, via resistor R12, to the first end of capacitor C1, the first end of resistor R15, and the control electrodes of semiconductor devices Q1 and Q01. The first electrode (anode in this example) of semiconductor device Q1 is coupled to first electrode (anode in this example) of semiconductor device Q01 and to the second end of solenoid SOU. The first end of solenoid SOL1 is coupled to the first end of auxiliary switch K1, and the second end of switch K2 is coupled to input end of the power supply lines. The second electrode (cathode in this example) of semiconductor device Q1 and the second electrode (cathode in this example) of semiconductor device Q01 are coupled in parallel, and are coupled to ground together with the second end of capacitor C1 and the second end of resistor R15. Resistor R4, light emitting diode LED, and diode D2 are coupled in series and then coupled in parallel with semiconductor device Q01. The second drive module 3 further includes capacitor C3 coupled in parallel with semiconductor device Q01.

The working principle of this embodiment is described below.

When the circuits of the leakage current detection and protection device operate normally, switch SW1 is closed (i.e. switch SW1 is normally closed). When the input end LINE is coupled to a power source, and the switch RESET of the second switching module is depressed by a user, the load is electrically coupled to the power source and operates normally.

When a leakage current is present in the power lines, detector coil CT1 detects the leakage current and sends a leakage current signal to processor U1 (the input end supplies a working power to processor U1 via resistor R1). Processor U1 outputs a control signal to the second drive module 3, which is applied via diode D5 and resister R12 to semiconductor devices Q1 and/or Q01 to trigger them to become conductive. Thus, a current loop is formed in L-K1-SOL1-(Q1 and/or Q01)-N. This generates a magnetic field in solenoid SOL1 to cause a switch RESET of the second switching module to open. This disconnects the power supply to the output end LOAD, thereby protecting the safety of the user and property.

When the leakage current is still present, and the user depresses the RESET switch of the second switching module, the leakage current detection and protection device will repeat the above operations to open the RESET switch (i.e. the device will trip again immediately after it is reset). After the leakage current problem is resolved, when the user depresses the RESET switch, the output end is electrically connected to the input end and the load at the output end operates normally. Further, the second drive module 3 employs semiconductor devices Q1 and Q01; when one of them is an open circuit, the other one can still operate normally. When any one of semiconductor devices Q1 and Q01 is a short circuit, a current loop is formed in L-K1-SOL1-(Q1 or Q01)-N. This generates a magnetic field in solenoid SOL1 to cause the RESET switch in the second switching module to open, thereby disconnecting the power supply to the output end LOAD.

When the leakage current detection and protection device operates normally, the self-test module 2 outputs a self-test pulse signal via processor U2, which is applied via resistor R11 to semiconductor device Q2, triggering it to become conductive. As a result, a simulated leakage current flows through detector coil CT1. If the leakage current detection module 1 operates normally, it will output a signal via processor U1 to trigger semiconductor device Q3 to become conductive (semiconductor device Q1 is not triggered in this condition). As a result, processor U2 stops outputting the signal, and semiconductor device Q2 becomes non-conductive, which completes one cycle of self-test.

When the leakage current protection function of the device is lost (for example, detector coil CT1 is a short or open circuit, processor U1 is faulty, the power supply resistor R1 of processor U1 is an open circuit, etc.), the self-test pulse signal, which is periodically generated by the self-test module 2 via processor U2, cannot be fed back to processor U2. Therefore, processor U2 outputs the self-test fault signal (e.g., it continues to output a high voltage signal), which charges capacitor C5 via resistor R10. As a result, diode D4 becomes conductive, which in turn triggers semiconductor device Q5 to become conductive. Thus, a current loop is formed in L-SOL2-Q5-N. This generates a magnetic field in solenoid SOL2 to cause switch SW1 in the first switching module to become permanently open (i.e., after switch SW1 is open, it cannot be reset and cannot re-connect the power source). This disconnects the power supply to the output end LOAD. In this condition, even when switch RESET of the second switching module is closed, power cannot be output to the output end LOAD, thereby protecting the safety of the user and property.

Further, when the circuits are operating normally, the current loop L-K1-SOL1-R4-LED-D2-N forms a normal condition display circuit (the display module). In other words, when the input end LINE is coupled to the power source, and the user depresses switch RESET of the second switching module, power is electrically coupled to the output end LOAD, and the LED emits light (i.e. it emits an indication signal) to indicate that the leakage current detection and protection device is in a normal operating condition. When solenoid SOL1 is open circuit, even if the user depresses switch RESET of the second switching module to electrically connect the power to the output end, the LED does not emit light (which functions as a warning signal), indicating that the leakage current detection and protection device is not operating normally.

Also, auxiliary switch K1 of the second drive module 3 is mechanically linked to switch RESET, i.e., auxiliary switch K1 and switch RESET are simultaneously open or closed. Thus, when switch RESET is open, auxiliary switch K1 is also open, which cuts off power supply to the self-test module 2 and second drive module 3 as shown in FIG. 1. It should be understood that, by suitably modifying the circuit, it can be achieved that when auxiliary switch K1 is open, the power supply to all of the control circuits (the leakage current detection module 1, self-test module 2, second drive module 3 and first drive module 4) is cut off.

In alternative embodiments, the second drive module 3 may include only one semiconductor device, or include additional semiconductor devices in addition to semiconductor devices Q1 and Q01; these additional semiconductor devices are coupled in parallel to semiconductor devices Q1 and Q01, and coupled to other circuit components in the same way that semiconductor devices Q1 and Q01 are coupled to them. In other alternative embodiments, the first drive module 4 may include two or more semiconductor devices, which are coupled in parallel and then coupled in series with solenoid SOL2, and the control electrodes of all these semiconductor devices are coupled to diode D4 of the self-test module 2. It should be understood that the semiconductor devices described above may be bipolar junction transistors, field-effect transistors (FET), metal-oxide-semiconductor field-effect transistors (MOSFETs), silicon-controlled rectifiers, or other similar devices. When semiconductor devices Q1 and Q01 are silicon-controlled rectifiers, their respective first electrode is the anode, and their respective second electrode is the cathode. When semiconductor devices Q1 and Q01 are MOSFETs, their respective first electrode is the source, their respective second electrode is the drain, and their respective control electrode is the gate. When semiconductor devices Q1 and Q01 are bipolar junction transistors, their respective first electrode is the collector, their respective second electrode is the emitter, and their respective control electrode is the base.

The leakage current detection and protection device according to these embodiments employs two switching modules to control the electrical disconnection between input and output ends in response to the leakage current signal and the self-test fault signal, respectively. This improves the protection function.

Figure 2:
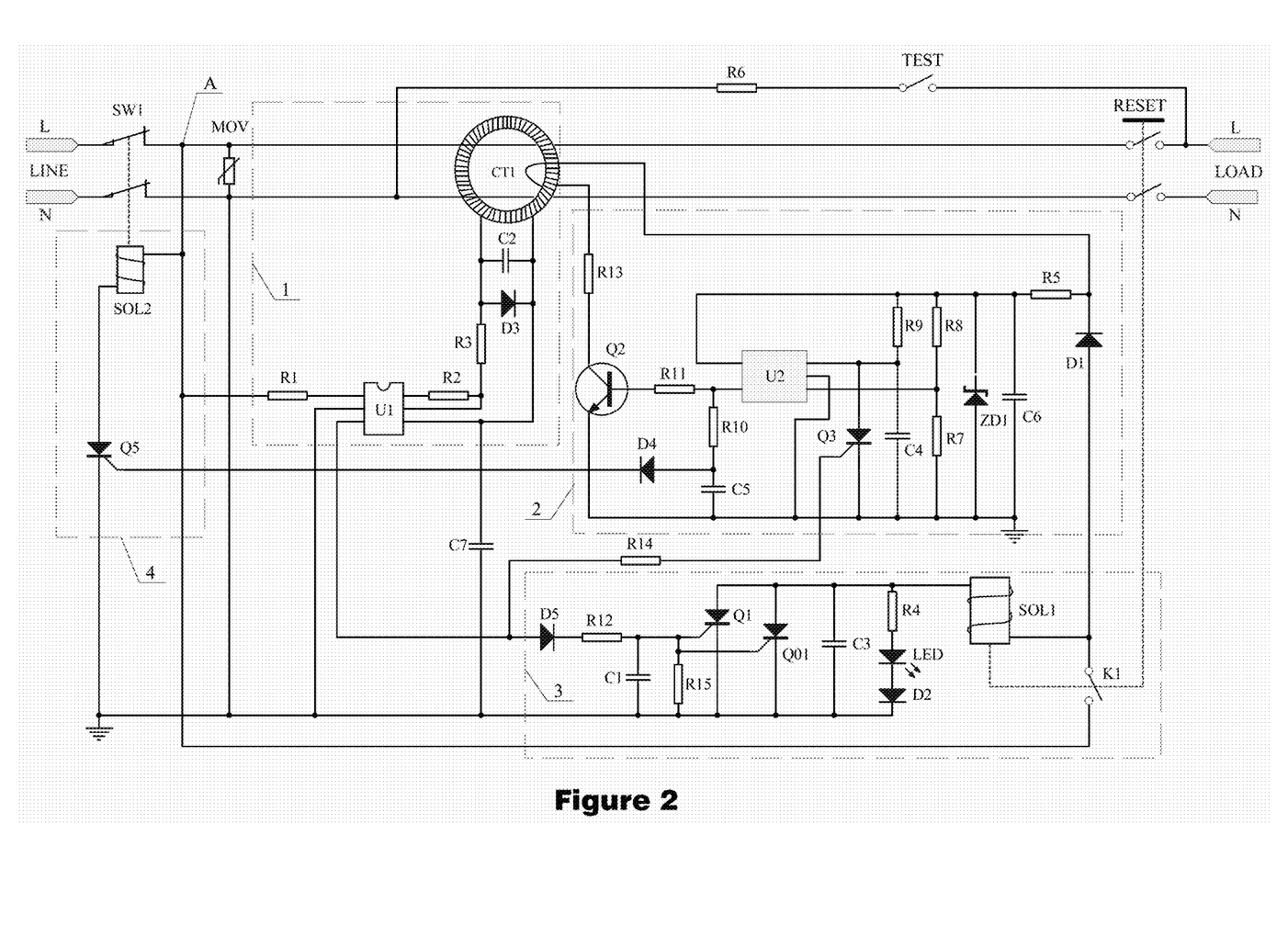
FIG. 2 is a circuit diagram of a leakage current detection and protection device according to a second embodiment of the present invention.

FIG. 2 is a circuit diagram of a leakage current detection and protection device according to a second embodiment of the present invention. The circuit of the second embodiment is similar to the circuit of the first embodiment, but the location of switch SW1 and the location of point A where the first drive module 4 is connected to the power lines are swapped. In the first embodiment shown in FIG. 1, point A is closer to the input end LINE than switch SW1 is; in the second embodiment shown in FIG. 2, switch SW1 is closer to the input end LINE than point A is. In FIG. 2, the leakage current detection module 1, self-test module 2, second drive module 3 and first drive module 4 are coupled to the power lines between the switch SW1 and the output end. In the embodiment of FIG. 1, when switch SW1 is open, the control circuits still receive power from the input end; in the embodiment of FIG. 2, when switch SW1 is open, the working power to all control circuits is cut off, which further improves safety.

The structure and operation of the second embodiment shown in FIG. 2 are otherwise similar to those of the first embodiment, and will not be described in more detail.

Figure 3:
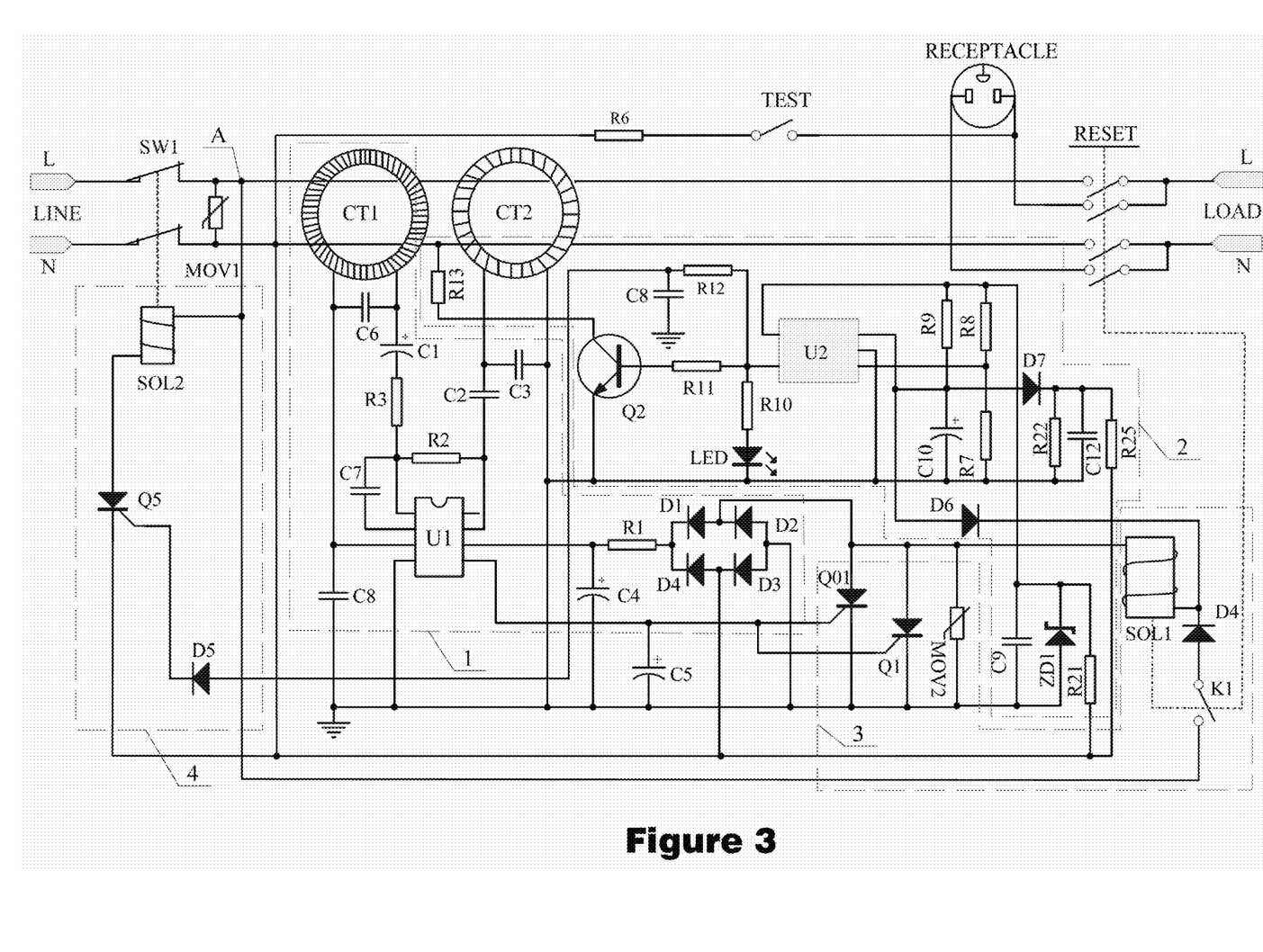
FIG. 3 is a circuit diagram of a leakage current detection and protection device according to a third embodiment of the present invention.

FIG. 3 is a circuit diagram of a leakage current detection and protection device according to a third embodiment of the present invention. The third embodiment is similar to the second embodiment, but the leakage current detection module 1 further includes another detector coil CT2, and working power is supplied to the leakage current detection module 1 via solenoid SOL1 (solenoid SOL1 supplies working power to at least the leakage current detection module 1). In the third embodiment shown in FIG. 3, the hot line L is coupled to a rectifier bridge via K1-SOL1, to supply working power to at least the leakage current detection module 1. When solenoid SOL1 is open circuit, processor U1 loses its working power; thus, when the self-test module 2 outputs a self-test pulse signal, because capacitor C10 cannot discharge, processor U2 continues to output a high voltage signal, which charges capacitor C8 via resistor R12, which in turn triggers semiconductor device Q5 to become conductive. This causes switch SW1 to open, thereby disconnecting the electrical connection between the input and output ends.

Figure 4:
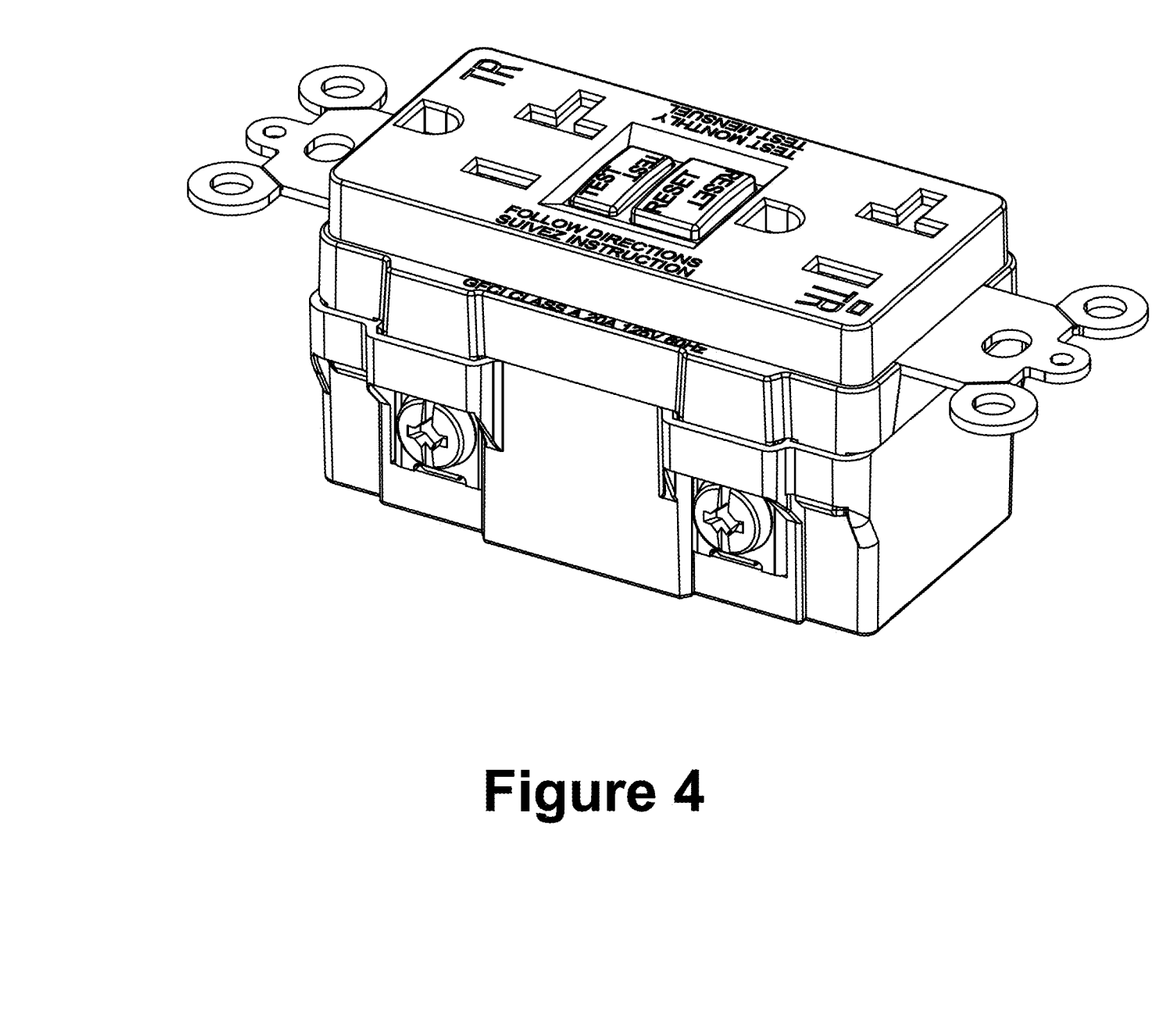
FIG. 4 illustrates a power connector according to an embodiment of the present invention.

FIG. 4 illustrates a power connector according to an embodiment of the present invention. The power connector includes a shell and the above-described leakage current detection and protection device disposed within the shell. The shell is provided with through holes for a first press button corresponding to the switch RESET and a second press button corresponding to the test switch TEST to pass through.

It will be apparent to those skilled in the art that various modification and variations can be made in the leakage current detection and protection device and related power connector and electrical appliance of the present invention without departing from the spirit or scope of the invention. Thus, it is intended that the present invention cover modifications and variations that come within the scope of the appended claims and their equivalents.

What is claimed is:

1. A leakage current detection and protection device coupled between an input end and an output end of power lines, the device comprising:
a first switching module and a second switching module, wherein each of the first and second switching modules is coupled on the power lines between the input end and the output end, wherein the first and second switching modules are operable to connect or disconnect an electrical connection between the input and output ends such that the input end is electrically connected to the output end when both the first and second switching modules are in their connected state, and the input end is electrically disconnected from the output end when either of the first and second switching modules is in its disconnected state;

a leakage current detection module configured to detect a leakage current signal on the power lines and to generate a leakage fault signal in response to detecting the leakage current signal;

a self-test module configured to detect a fault of the leakage current detection module and to output a self-test fault signal when the fault in the leakage current detection module is detected;

a first drive module, coupled to the self-test module and the first switching module, and configured, in response to the self-test fault signal, to control the first switching module to disconnect the electrical connection between the input and output ends; and a second drive module, coupled to the leakage current detection module and the second switching module, and configured, in response to the leakage fault signal, to control the second switching module to disconnect the electrical connection between the input and output ends, wherein the first and second drive modules are separate from each other and configured to separately control the first and second switching modules, respectively.

2. The leakage current detection and protection device of claim 1, wherein the first switching module includes a first switch, the first drive module includes a first solenoid and a first semiconductor device coupled in series with the first solenoid, the first switch is coupled to the first solenoid, a control electrode of the first semiconductor device is coupled to the self-test module, the first semiconductor device is configured to become conductive in response to receiving the self-test fault signal at the control electrode, the first solenoid is configured to generate a magnetic field in response to the first semiconductor device becoming conductive, and the first switch is configured to disconnect the electrical connection in response to the magnetic field being generated in the first solenoid.

3. The leakage current detection and protection device of claim 2, wherein the first switch is a normally closed switch and is configured to be prevented from closing after becoming open in response to the magnetic field.

4. The leakage current detection and protection device of claim 2, wherein the first semiconductor device is a silicon-controlled rectifier, a metal-oxide-semiconductor field-effect transistor, or a bipolar junction transistor.

5. The leakage current detection and protection device of claim 1, wherein the first switching module includes a first switch, the first drive module includes a first solenoid and at least two semiconductor devices, the first switch is coupled to the first solenoid, the least two semiconductor devices are coupled in parallel with each other and then coupled in series with the first solenoid, a control electrode of each of the at least two semiconductor devices is coupled to the self-test module, at least one of the at least two semiconductor devices is configured to become conductive in response to receiving the self-test fault signal at its control electrode, the first solenoid is configured to generate a magnetic field in response to the at least one of the at least two semiconductor devices becoming conductive, and the first switch is configured to disconnect the electrical connection in response to the magnetic field being generated in the first solenoid.

6. The leakage current detection and protection device of claim 5, wherein the first switch is a normally closed switch and is configured to be prevented from closing after becoming open in response to the magnetic field.

7. The leakage current detection and protection device of claim 5, wherein each of the at least two semiconductor devices is a silicon-controlled rectifier, a metal-oxide-semiconductor field-effect transistor, or a bipolar junction transistor.

8. The leakage current detection and protection device of claim 1, wherein the first switching module is coupled on the power lines between the input end and a first point of the power lines, wherein the leakage current detection module, the self-test module, the first drive module and the second drive module are coupled to the power lines between the first point and the output end, and wherein when the first switching module disconnects the electrical connection between the input and output ends, the leakage current detection module, the self-test module, the first drive module and the second drive module are de-powered.

9. The leakage current detection and protection device of claim 8, wherein the second solenoid is configured to supply a working power to the leakage current detection module.

10. The leakage current detection and protection device of claim 9, wherein the self-test module generates a self-test fault signal in response to the second solenoid being an open circuit, and wherein the first drive module is configured, in response to receiving the self-test fault signal, to control the first switching module to disconnect the electrical connection between the input and output ends.

11. The leakage current detection and protection device of claim 1, wherein the leakage current detection module, the self-test module, the first drive module and the second drive module are coupled to the power lines between the input end and the first switching module.

12. A power connector, comprising:
a shell; and
the leakage current detection and protection device of claim 1 disposed in the shell.

13. A leakage current detection and protection device coupled between an input end and an output end of power lines, the device comprising:

a first switching module and a second switching module, wherein each of the first and second switching modules is coupled on the power lines between the input end and the output end and is operable to connect or disconnect an electrical connection between the input and output ends;

a leakage current detection module configured to detect a leakage current signal on the power lines and to generate a leakage fault signal in response to detecting the leakage current signal;

a self-test module configured to detect a fault of the leakage current detection module and to output a self-test fault signal when the fault in the leakage current detection module is detected;

a first drive module, coupled to the self-test module and the first switching module, and configured, in response to the self-test fault signal, to control the first switching module to disconnect the electrical connection between the input and output ends; and a second drive module, coupled to the leakage current detection module and the second switching module, and configured, in response to the leakage fault signal, to control the second switching module to disconnect the electrical connection between the input and output ends, wherein the second switching module includes a second switch, the second drive module includes a second solenoid and a second semiconductor device coupled in series with the second solenoid, the second switch is coupled with the second solenoid, a control electrode of the second semiconductor device is coupled to the leakage current detection module, wherein either the second semiconductor device is configured to become conductive in response to receiving the leakage fault signal at its control electrode, the second solenoid is configured to generate a magnetic field in response to the second semiconductor device becoming conductive, and the second switch is configured to disconnect the electrical connection in response to the magnetic field being generated in the second solenoid, or the second solenoid is configured to generate a magnetic field in response to the second semiconductor device becoming a short circuit, and the second switch is configured to disconnect the electrical connection in response to the magnetic field being generated in the second solenoid.

14. The leakage current detection and protection device of claim 13, wherein the second drive module includes a display module, coupled in parallel to the second semiconductor device, and configured to generate a warning display in response to the second solenoid becoming an open circuit.

15. The leakage current detection and protection device of claim 13, wherein the second switch is configured to be reset after becoming open in response to the magnetic field.

16. The leakage current detection and protection device of claim 13, wherein the second semiconductor device is a silicon-controlled rectifier, a metal-oxide-semiconductor field-effect transistor, or a bipolar junction transistor.

17. A leakage current detection and protection device coupled between an input end and an output end of power lines, the device comprising:

a first switching module and a second switching module, wherein each of the first and second switching modules is coupled on the power lines between the input end and the output end and is operable to connect or disconnect an electrical connection between the input and output ends;

a leakage current detection module configured to detect a leakage current signal on the power lines and to generate a leakage fault signal in response to detecting the leakage current signal;

a self-test module configured to detect a fault of the leakage current detection module and to output a self-test fault signal when the fault in the leakage current detection module is detected;

a first drive module, coupled to the self-test module and the first switching module, and configured, in response to the self-test fault signal, to control the first switching module to disconnect the electrical connection between the input and output ends; and a second drive module, coupled to the leakage current detection module and the second switching module, and configured, in response to the leakage fault signal, to control the second switching module to disconnect the electrical connection between the input and output ends, wherein the second switching module includes a second switch, the second drive module includes a second solenoid and at least two semiconductor devices, the second switch is coupled to the second solenoid, the least two semiconductor devices are coupled in parallel with each other and then coupled in series with the second solenoid, and a control electrode of each of the at least two semiconductor devices is coupled to the leakage current detection module, wherein either at least one of the at least two semiconductor devices is configured to become conductive in response to receiving the leakage fault signal at its control electrode, the second solenoid is configured to generate a magnetic field in response to the at least one of the at least two semiconductor devices becoming conductive, and the second switch is configured to disconnect the electrical connection in response to the magnetic field being generated in the second solenoid, or the second solenoid is configured to generate a magnetic field in response to the at least one of the at least two semiconductor devices becoming a short circuit, and the second switch is configured to disconnect the electrical connection in response to the magnetic field being generated in the second solenoid.

18. The leakage current detection and protection device of claim 17, wherein the second drive module includes a display module, coupled in parallel to the at least two semiconductor devices, and configured to generate a warning display in response to the second solenoid becoming an open circuit.

19. The leakage current detection and protection device of claim 17, wherein the second switch is configured to be reset after becoming open in response to the magnetic field.

20. The leakage current detection and protection device of claim 17, wherein each of the at least two semiconductor devices is a silicon-controlled rectifier, a metal-oxide-semiconductor field-effect transistor, or a bipolar junction transistor.

* * * * *